United States Patent
Holder et al.

(10) Patent No.: US 6,315,828 B1
(45) Date of Patent: *Nov. 13, 2001

(54) CONTINUOUS OXIDATION PROCESS FOR CRYSTAL PULLING APPARATUS

(75) Inventors: John D. Holder; Bayard K. Johnson, both of Lake St. Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/489,481

(22) Filed: Jan. 21, 2000

Related U.S. Application Data

(63) Continuation of application No. 09/167,747, filed on Oct. 7, 1998, now Pat. No. 6,039,801.

(51) Int. Cl.[7] .................................................. C30B 15/14
(52) U.S. Cl. ........................... 117/208; 117/19; 117/20; 117/932
(58) Field of Search ....................... 117/19, 20, 208, 117/932

(56) References Cited

U.S. PATENT DOCUMENTS

| | | | |
|---|---|---|---|
| 5,037,503 | 8/1991 | Kajimoto et al. | 117/932 |
| 5,131,974 | 7/1992 | Oda et al. | 117/20 |
| 5,270,020 | 12/1993 | Suzuki et al. | 117/932 |
| 5,373,804 | 12/1994 | Tachimori et al. | 117/20 |
| 5,785,757 | 7/1998 | Hiraishi | 117/218 |
| 5,904,768 | 5/1999 | Holder | 117/208 |
| 6,039,801 | 3/2000 | Holder et al. | 117/20 |

FOREIGN PATENT DOCUMENTS

| | | |
|---|---|---|
| 0608875 A1 | 8/1994 | (EP) . |
| 0819783 A1 | 7/1996 | (EP) . |
| 06087687 | 3/1994 | (JP) . |

*Primary Examiner*—Robert Kunemund
(74) *Attorney, Agent, or Firm*—Senniger, Powers, Leavitt & Roedel

(57) ABSTRACT

A continuous oxidation process and apparatus for using the same are disclosed. During growth of a semiconductor crystal an oxygen-containing gas is continuously injected into the crystal pulling apparatus in an exhaust tunnel downstream from the hot zone to continuously oxidize hypostoichiometric silicon dioxide, silicon vapor, and silicon monoxide produced in the hot zone during the crystal growth so as to minimize or eliminate the possibility of rapid over-pressurization of the apparatus upon exposure to the atmosphere.

23 Claims, 2 Drawing Sheets

CONTINUOUS OXIDATION PROCESS FOR CRYSTAL PULLING APPARATUS

This application is a continuation of application Ser. No. 09/167,747 filed on Oct. 7, 1998 now U.S. Pat. No. 6,039,801.

BACKGROUND OF THE INVENTION

The present invention relates to a process for oxidizing silicon monoxide, silicon vapor, and hypostoichiometric silicon dioxide in a crystal pulling apparatus. More particularly, the present invention relates to a continuous oxidation process wherein an oxygen-containing gas is continuously injected into a crystal pulling apparatus to continuously oxidize silicon monoxide, silicon vapor, and hypostoichiometric silicon dioxide as it is produced.

Single crystal silicon which is the starting material for most processes for the fabrication of semiconductor electronic components is commonly prepared with the so-called Czochralski process. In this process, a crystal pulling apparatus purged with a continuous stream of argon is utilized wherein polycrystalline silicon ("polysilicon") is charged to a quartz crucible, the polysilicon is melted, a seed crystal is immersed into the molten silicon and a single crystal silicon ingot is grown by slow extraction.

During the crystal growth process, substantial amounts of silicon containing compounds such as gaseous silicon monoxide ($SiO(g)$) and silicon vapor ($Si(g)$) are produced and released into the atmosphere in the apparatus. $SiO(g)$ is evaporated from the melt due to the enriching with oxygen through the dissolution of the crucible by the silicon melt, as well as the interaction of the crucible with the graphite susceptor supports. Additionally, the vapor pressure of the $Si(g)$ over the silicon liquid at the silicon melting point is about 0.5 Torr which may account for a moderate quantity of $Si(g)$ being produced during ingot growth. Because $SiO(g)$ is extremely unstable, it readily reacts with other molecules of $SiO(g)$ produced from the crucible dissolution to produce silicon dioxide (solid) ($SiO_2(s)$) and silicon (solid) ($Si(s)$). However, because the amount of available oxygen within the crystal pulling apparatus is limited, a substantial amount of the $SiO_2(s)$ which is formed is oxygen deficient, or hypostoichiometric. Also, the $Si(g)$ evaporated from the melt which may condense on the hot zone exhaust system parts is very reactive with oxygen.

The mixture of hypostoichiometric $SiO_2(s)$ and condensed $Si(g)$ produced as a by-product in the crystal pulling apparatus is a major problem in the crystal pulling industry as it tends to stick and become attached to many parts of the pulling apparatus and exhaust system. When the apparatus and exhaust system are opened to the atmosphere after the ingot is grown, and the hypostoichiometric $SiO_2(s)$ is mixed with large amounts of oxygen, it can smolder, burn and release substantial amounts of heat which can cause serious damage to internal parts of the apparatus as well as the exhaust system. Furthermore, if sufficient amounts of hypostoichiometric $SiO_2(s)$ are present in a dust form, an explosion and resulting rapid over pressurization of the pulling apparatus can occur and cause substantial damage to the apparatus and workers.

Conventionally, the dangers of rapid over pressurization of the apparatus and burning of parts due to the reaction of hypostoichiometric $SiO_2(s)$ and oxygen has been controlled through the use of a post-run oxidation step which consists of backfilling the evacuated crystal puller with an oxygen-containing gas such as air at a slow rate over a period of up to about 24 hours. The oxygen in the air slowly reacts with and oxidizes the hypostoichiometric $SiO_2(s)$ to produce $SiO_2(s)$ containing sufficient oxygen and reduces the risk of over pressurization. By adding time to the process cycle, the throughput of the pulling apparatus is significantly reduced. Additionally, because up to about 95% of the hypostoichiometric $SiO_2(s)$ accumulation is on water cooled surfaces or exhaust piping several feet from the hot zone and hence near room temperature, the oxidation rate of the accumulated oxide is much less efficient than desired and some risk to equipment and workers may still exist.

Therefore, a need exists in the semiconductor industry for an efficient process that can substantially eliminate the dangers of hypostoichiometric $SiO_2(s)$ without decreasing the throughput of the crystal pulling apparatus.

SUMMARY OF THE INVENTION

Among the objects of the present invention, therefore, are the provision of a process for reducing the amount of hypostoichiometric silicon dioxide in a crystal pulling apparatus; the provision of a process for increasing overall throughput of grown ingots; the provision of a process for continuously oxidizing hypostoichiometric silicon dioxide as it is produced in a crystal pulling apparatus; the provision of a process for introducing oxygen near the hot zone to oxidize hypostoichiometric silicon dioxide without causing perfect structure loss of the growing crystal; and the provision of a process which eliminates the post-run oxidation step.

Briefly, therefore, the present invention is directed to a process for reducing the amount of hypostoichiometric silicon dioxide in a crystal pulling apparatus through continuous oxidation of silicon compounds produced during production of silicon ingots. The process comprises continuously injecting an argon gas stream into the apparatus above the hot zone during ingot growth such that the argon stream flows downwardly within the apparatus through the hot zone and into an exhaust tunnel and continuously injecting an oxygen containing gas through an inlet in the exhaust tunnel in the apparatus at a position downstream from the hot zone relative to the argon gas flow to continuously oxidize silicon monoxide, silicon vapor and hypostoichiometric silicon dioxide produced during ingot growth.

The invention is further directed to a process for reducing the amount of hypostoichiometric silicon dioxide in a crystal pulling apparatus through continuous oxidation of silicon compounds produced during production of silicon ingots. The process comprises continuously injecting an argon gas stream into the apparatus above the hot zone during ingot growth such that the argon stream flows downwardly within the apparatus through the hot zone and into an exhaust tunnel and continuously injecting an oxygen containing gas through an inlet in the exhaust tunnel in the apparatus at a position downstream from the hot zone relative to the argon gas flow to continuously oxidize silicon monoxide, silicon vapor and hypostoichiometric silicon dioxide produced during ingot growth without allowing sufficient oxygen to enter the hot zone and cause perfect structure loss in the growing ingot.

The invention is further directed to a process for reducing the amount of hypostoichiometric silicon dioxide in a crystal pulling apparatus through continuous oxidation of silicon compounds produced during production of silicon ingots. The process comprises continuously injecting an argon gas stream into the apparatus above the hot zone during ingot growth such that the argon stream flows downwardly within the apparatus through the hot zone and into an exhaust tunnel and continuously injecting an oxygen containing gas through an inlet in an exhaust tunnel in the apparatus at a position downstream from the hot zone relative to the argon gas flow to continuously oxidize silicon monoxide, silicon vapor and hypostoichiometric silicon dioxide at a temperature of at least 600° C. produced during ingot growth without allowing sufficient oxygen to enter the hot zone and cause perfect structure loss in the growing ingot.

The invention is further directed to a crystal pulling apparatus for continuously oxidizing silicon monoxide, silicon vapor, and hypostoichiometric silicon dioxide produced during a crystal growing process. The apparatus comprises a housing, a hot zone containing a crucible, and a gas inlet located above the hot zone for allowing an argon gas stream to enter the apparatus and flow through the hot zone and into an exhaust tunnel to purge hot exhaust gases from the hot zone. The apparatus further comprises a gas inlet in an exhaust tunnel downstream from the hot zone relative to the direction of flow of the argon gas for allowing an oxygen-containing gas to continuously enter the pulling apparatus and oxidize silicon monoxide, silicon vapor, and hypostoichiometric silicon dioxide produced in the hot zone during the crystal growth.

Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

In accordance with the present invention, it has been discovered that by introducing an oxygen-containing gas through an inlet into an exhaust tunnel in a crystal pulling apparatus and allowing it to continuously mix with the hot exhaust gases produced in the hot zone of the apparatus during ingot growth the hypostoichiometric $SiO_2$ accumulations downstream of the gas inlet are sufficiently oxidized and have near $SiO_2$ stoichiometry and hence are not subject to substantial reaction with oxygen at a later time. Surprisingly, with sufficient argon flow, it has been shown that locating the gas inlet in an exhaust tunnel in close relation to the hot zone sufficiently oxidizes unwanted $SiO(g)$, $Si(g)$, and hypostoichiometric $SiO_2(s)$ but does not result in perfect structure loss or other defects in the growing crystal or resulting sliced wafers.

Figure 1:
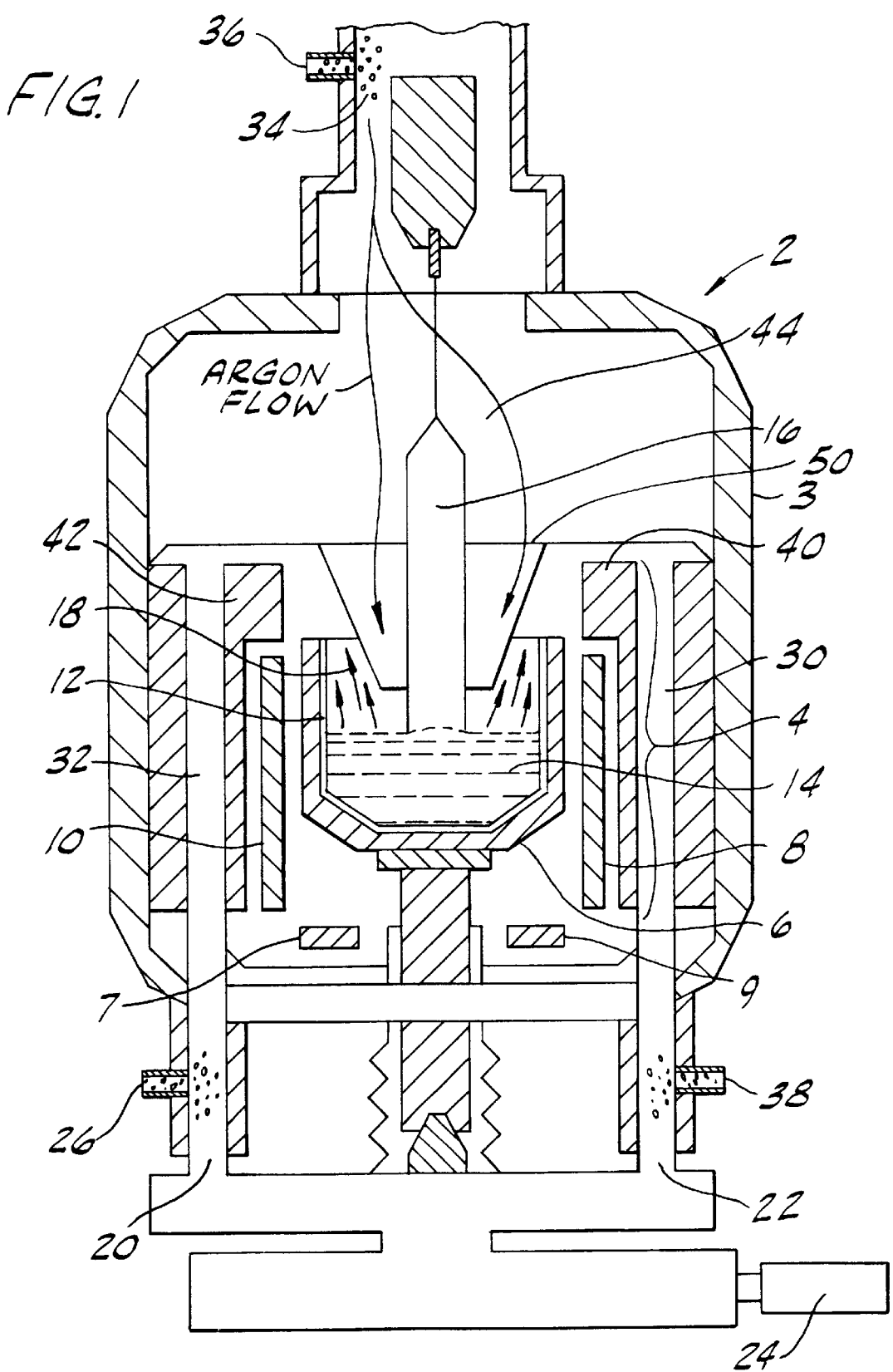
FIG. 1 is a schematic diagram of a crystal pulling apparatus in accordance with the present invention.

Referring now to FIG. 1, there is shown a crystal pulling apparatus 2 which has a housing 3, a crystal growth chamber 44, a hot zone 4, and a purge tube 50. The hot zone region of the crystal pulling apparatus is generally located below the crystal growth chamber and may contain such parts as susceptors, heaters, thermal shields, heat reflectors, and insulation. The hot zone region controls the heat flow around the crucible and the cooling rate of the growing ingot throughout the growth process. It is the hot zone region where unwanted $SiO(g)$, $Si(g)$, and hypostoichiometric $SiO_2(s)$ are produced during ingot growth due to the numerous chemical interactions described above.

The purge tube 50 contained in the apparatus 2 directs argon gas entering the growth chamber 44 around the growing crystal 16. This direction of argon gas helps to continuously clean and cool the growing crystal more efficiently. An apparatus containing a purge tube may be referred to in the art as an "advanced CZ crystal growth apparatus." It will be recognized by one skilled in the art, however, that the present invention can also be utilized with an open hot zone commonly referred to in the art as "standard CZ growth" wherein a purge tube is not utilized.

Referring again to FIG. 1, the hot zone 4 of crystal pulling apparatus 2 contains purge tube 50, susceptor 6, heaters 7, 8, 9, and 10, crucible 12, and heat shields 40 and 42. It will be recognized by one skilled in the art that other graphite parts could also be utilized in the hot zone without departing from the scope of the present invention. Crucible 12 contains polysilicon 14 which is melted by the heaters to produce molten silicon and allow crystal 16 to be slowly extracted from crucible 12. Susceptor 6 holds crucible 12 in place while crystal 16 is extracted.

During crystal growth argon 34 is continuously introduced near the top of the crystal pulling apparatus 2 through inlet 36 as a purging gas and flows downwardly into the crystal growth chamber 44, into purge tube 50, along the growing ingot 16 and into the hot zone 4 where it mixes with hot exhaust gases 18 and into exhaust tunnels 30 and 32. The argon-exhaust gas mixture flows through tunnels 30 and 32 and through outlets 20 and 22 into exhaust system 24. The argon 34 has a Laminar flow pattern throughout the crystal pulling apparatus and removes the hot exhaust gases 18 which contain $SiO(g)$, $Si(g)$, and hypostoichiometric $SiO_2(s)$ produced in hot zone 4 during crystal growth. Exhaust tunnels 30 and 32 can have a diameter between about 2 inches to about 6 inches, preferably between about 3 inches to about 5 inches, and most preferably about 4 inches.

In accordance with the present invention, the crystal pulling apparatus 2 as shown in FIG. 1 also contains gas inlets 26 and 38 which are located in exhaust tunnels 30 and 32 downstream from hot zone 4 relative to the flow of argon 34. These inlets allow an oxygen containing gas, such as air (about 21% oxygen in air) to be mixed with hot exhaust gases 18 which contain $SiO(g)$, $Si(g)$, and hypostoichiometric $SiO_2(s)$ produced during crystal growth in exhaust tunnels 30 and 32. The hot gases are carried away from hot zone 4 by argon 34 past gas inlets 26 and 38 through outlets 20 and 22 in exhaust tunnels 30 and 32. By allowing the oxygen-containing gas to mix and react with the hot exhaust gases produced in the hot zone, the hypostoichiometric oxide accumulations downstream of the gas inlet are near $SiO_2$ stoichiometry and are not subject to substantial reaction when contacted with oxygen at a later time.

Gas inlets 26 and 38 located in exhaust tunnels 30 and 32 which allow the oxygen containing gas to enter into the crystal pulling apparatus have a diameter of between about 0.1 centimeters and about 4.0 centimeters, preferably about 0.5 centimeters, and may be comprised of stainless steel for example. The inlets should be located in exhaust tunnels 30 and 32 at a position downstream of the hot zone relative to the flow of argon in order to minimize the amount of oxygen which back diffuses through the argon purge and into the hot zone containing the silicon melt and growing crystal. If sufficient oxygen is able to back diffuse through the argon and into the hot zone, it can react with and oxidize hot graphite parts located in this region. Furthermore, oxygen in the hot zone can enter the atmosphere around the growing crystal and result in loss of perfect structure.

The gas inlets for allowing the oxygen containing gas to enter the exhaust tunnels in the apparatus should be positioned such that the diffusion of oxygen from the oxygen-containing gas through the argon purging gas and into the hot zone is not sufficient to create loss of perfect structure in the growing crystal. The diffusion of oxygen into the hot zone should be no greater than about 100 ppm, preferably no greater than about 50 ppm, and most preferably no greater than about 10 ppm. Generally the argon gas flow through the argon inlet and into the apparatus is between about 20 slm to about 150 slm, preferably between about 60 slm to about 100 slm to create a pressure of between about 5 Torr and about 25 Torr, preferably between about 12 Torr and about 18 Torr in the crystal pulling apparatus.

Figure 2:
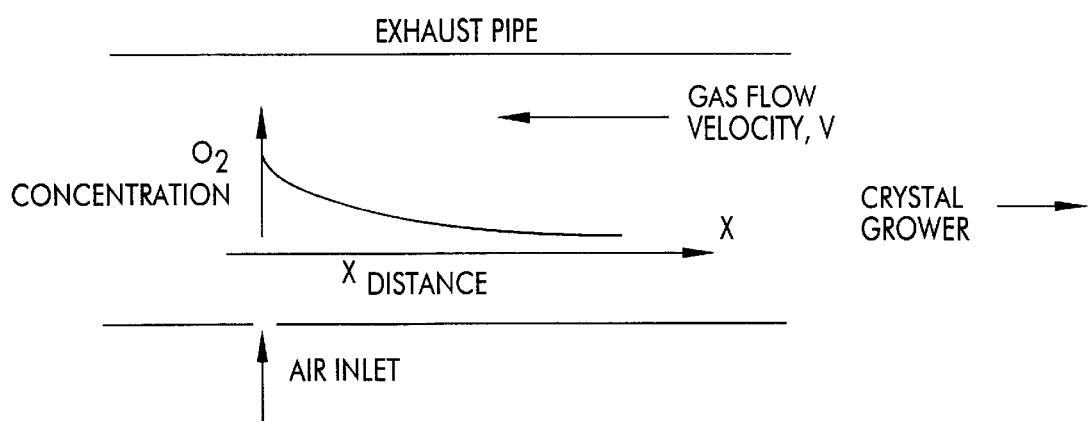
FIG. 2 is a diagram of an exhaust tunnel portion of a crystal pulling apparatus which shows the movement of gases within the pipe.

Referring now to FIG. 2, the concentration, C, of oxygen in the gas (argon) stream as a function of distance, x, from the gas inlet can be determined by solving the steady state diffusion equation (1), which includes convection:

$$V\partial C/\partial x + D\partial^2 C/\partial x^2 = 0 \tag{1}$$

where V is the gas (argon) velocity and D is the diffusivity of oxygen in argon. For boundary conditions $C=C_0$ at $x=0$, and $C=0$ at $x=$infinity the solution is:

$$C(x) = C_0 e^{(-Vx/D)} \tag{2}$$

At an argon gas pressure of about 14 Torr and a temperature of about 1000° K, the diffusion coefficient of oxygen in argon is about 77.3 cm²/sec (Extrapolated from data in CRC Handbook of Chemistry and Physics, 75$^{th}$ Edition, pp. 6-251–252, (1994).) At a gas flow rate of about 20 slm into four 4 inch exhaust pipes at the same temperature and pressure, the gas velocity (V) is calculated according to formula (3):

$$V(v)(1/\pi r^2)(T_{gas}/T_{std})(P_{std}/P_{gas}) \tag{3}$$

wherein v is the gas volume flow rate, r is the radius of the pipe, $T_{gas}$ is the temperature of the gas, $T_{std}$ is 300 K, $P_{gas}$ is the pressure of the gas, and $P_{std}$ is 760 Torr. Thus, the gas velocity in each pipe is about 186 centimeters/second. Therefore, using formula (2) above, the oxygen concentration (in air) would be reduced by a factor of (4)

$$C(x)/C_0 = 10^{-5} \tag{4}$$

in a distance of about 4 centimeters from the gas inlet.

Assuming the above values, back diffusion of oxygen in air against the argon gas stream over distances greater than about 5 centimeters would not exceed 10 ppma. This level of oxygen in the hot zone is acceptable for crystal growing and will not result in significant burning of hot graphite parts or perfect structure loss. Therefore, for an air inlet flow rate of about 10 slm and an argon gas flow rate of 100 slm exhausting into four 4 inch pipes, the oxygen concentration at about 2.0 centimeters from the gas inlet would be on the order of less than about 1 ppt (molecular) oxygen. Thus, for air injected into the pulling apparatus at a distance greater than about 2 centimeters from the hot zone, the problems associated with the presence of oxygen in the crystal growing chamber should not occur.

If the quartz dissolution rate of the quartz crucible utilized in the crystal pulling apparatus is assumed to be about $9.03 \times 10^{-7}$ cm/sec as experimentally determined by applicants, the rate of production of SiO(g) from the crucible dissolution can be estimated. Utilizing this estimate, the air flow rate needed to provide sufficient oxygen to completely convert the SiO(g) to stoichiometric $SiO_2$ can be calculated.

The volume of the crucible dissolved, $V_D$ can be calculated according to the equation (5):

$$V_d = AR_D \tag{5}$$

wherein A is the area in contact with the melt and $R_d$ is the rate of dissolution of the crucible, or $9.03 \times 10^{-7}$ cm/sec. Utilizing a crucible having a 23 inch radius and a height of 7 inches (commonly used in a 24 inch hot zone), $V_d$ is equal to about 0.33201 cm³/minute, or about 0.0123 moles $SiO_2$/minute.

$SiO_2(s)$ dissolves and is evaporated from the melt according to equation (6):

$$SiO_2(s) + Si(l) \rightarrow 2SiO(g) \tag{6}$$

Therefore, a dissolution of 0.0123 moles $SiO_2(s)$ per minute produces about 0.0247 moles of SiO(g) per minute, or about 0.5530 liters of SiO(g) per minute.

Sio(g) reacts with oxygen to produce $SiO_2(s)$ according to equation (7):

$$SiO(g) + 1/2 O_2 \rightarrow SiO_2(s) \tag{7}$$

Therefore, as one half liter of oxygen is required to react with every liter of SiO(g) produced, about 1.3167 liters/minute of air are required to produce sufficient oxygen to completely react with the SiO(g) produced from the quartz dissolution in a 24 inch hot zone.

In order to obtain the maximum oxidation efficiency for the conversion of SiO(g) to stable $SiO_2(s)$ and hypostoichiometric $SiO_2(s)$ to stable $SiO_2(s)$, the SiO(g) and hypostoichiometric $SiO_2(s)$ should be at an elevated temperature of between about 600° C. to about 800° C., preferably about 700° C. when reacted with oxygen. However, because it is possible that some SiO(g) or hypostoichiometric $SiO_2(s)$ can exist at temperatures much lower that 600° C., an increase in the air (or other oxygen containing gas utilized) flow should be utilized to compensate for oxidation efficiency lower than 100%. Generally, the flow rate of the oxygen containing gas into the apparatus is between about 5 and about 10 times higher than the flow rate calculated for 100% efficiency such that between about 5 and about 20 slm, preferably about 10 slm of is injected into the apparatus. Also, the gas inlet should be place as close to the crystal growth hot zone as possible to achieve maximum oxidation efficiency.

The present invention is illustrated by the following examples which are merely for the purpose of illustration and is not to be regarded as limiting the scope of the invention or manner in which it may be practiced.

EXAMPLE 1

In this example, a gas inlet and a gas analyzer were installed on a crystal pulling apparatus to allow air to be injected into the apparatus downstream from the hot zone during crystal growth and the gas from the hot zone monitored for the presence of oxygen.

On a crystal pulling apparatus an air inlet and mass flow controller for air were placed in a 4 inch exhaust line about 30 feet from the hot zone. A sampling port for a Quadrupole Gas Mass Analyzer was placed in the same exhaust pipe about 5 feet from the downstream from the hot zone and about 25 feet upstream from the air inlet. The flow rate for the air inlet was 10 slm and the argon purge flow rate was set at 115 slm. The pulling apparatus had a pressure of about 23 Torr. The pulling cycle was completed in 102 hours and produced a complete ingot. After growth of the ingot, the pulling apparatus was opened to the atmosphere and samples of oxide accumulation were taken for comparison to samples taken from an exhaust system utilized without continuous oxidation.

Throughout the crystal pulling process the gas analyzer collected and analyzed data, but did not detect any oxygen in the sampled gas. Additionally, no crystal structure loss was attributable to an air leak or from the controlled air inlet. The dark orange color of the oxide samples collected indicated that some hypostoichiometric SiO remained in the apparatus after the process was complete.

EXAMPLE 2

In this example a gas inlet and a gas analyzer were installed on a crystal pulling apparatus to allow air to be injected into the apparatus downstream from the hot zone during crystal growth and the gas from the hot zone monitored for the presence of oxygen.

On the same crystal pulling apparatus as utilized in Example 1, the controlled air inlet was moved to about 11 feet from the gas analyzer, and about 16 feet from the hot zone. The pulling apparatus was operated under the same conditions as in Example 1.

Throughout the crystal pulling process the gas analyzer collected and analyzed data, but did not detect any oxygen in the sampled gas. Additionally, no crystal structure loss was attributable to an air leak or from the controlled air inlet. The lighter orange color of the oxide samples as compared to Example 1 indicated a reduced amount of hypostoichiometric SiO remained in the apparatus.

EXAMPLE 3

In this example a gas inlet and a gas analyzer were installed on a crystal pulling apparatus to allow air to be injected into the apparatus downstream from the hot zone during crystal growth and the gas from the hot zone monitored for the presence of oxygen.

On the same crystal pulling apparatus as utilized in Example 1, the controlled air inlet was moved to about 6 feet from the gas analyzer, and about 11 feet from the hot zone. The pulling apparatus was operated under the same conditions as in Example 1.

Throughout the crystal pulling process the gas analyzer collected and analyzed data, but did not detect any oxygen in the sampled gas. Additionally, no crystal structure loss was attributable to an air leak or from the controlled air inlet. The light orange color of the oxide samples as compared to Examples 1 and 2 indicated a reduced amount of hyposto-ichiometric SiO remained in the apparatus.

EXAMPLE 4

In this example a gas inlet and a gas analyzer were installed on a crystal pulling apparatus to allow air to be injected into the apparatus downstream from the hot zone during crystal growth and the gas from the hot zone monitored for the presence of oxygen.

On the same crystal pulling apparatus as utilized in Example 1, the controlled air inlet was split into four streams with each stream about 6 feet from the hot zone. The gas analyzer sampling port was placed in a 6 inch offset section of the vacuum piping about 2.5 feet upstream of the four, split air inlet streams. The gas analyzer sampling port was about 3.5 feet downstream from the hot zone.

Throughout the crystal pulling process the gas analyzer collected and analyzed data, but did not detect any oxygen in the sampled gas. Additionally, no crystal structure loss was attributable to an air leak or from the controlled air inlet.

The pale orange color of the oxide samples indicated a significantly reduced amount of hypostoichiometric SiO remained in the apparatus as compared to Examples 1, 2 and 3.

EXAMPLE 5

In this example a gas inlet and a gas analyzer were installed on a crystal pulling apparatus to allow air to be injected into the apparatus downstream from the hot zone during crystal growth and the gas from the hot zone monitored for the presence of oxygen.

On the same crystal pulling apparatus as utilized in Example 1, the controlled air inlet was split into four streams with each stream about 80 centimeters from the hot zone, and the gas analyzer was placed 40 centimeters upstream from the air inlet. The air flow was set at 10 slm, and the argon flow was set at 100 slm to create a pressure of about 15 Torr in the apparatus.

Throughout the crystal pulling process the gas analyzer collected and analyzed data, but did not detect any oxygen in the sampled gas. Additionally, no crystal structure loss was attributable to an air leak or from the controlled air inlet. The white color of the oxide samples as compared to Examples 1, 2, 3, and 4 indicated stoichiometric $SiO_2$.

In view of the above, it will be seen that the several objects of the invention are achieved.

As various changes could be made in the above-described continuous oxidation process without departing from the scope of the invention, it is intended that all matter contained in the above description be interpreted as illustrative and not in a limiting sense.

What is claimed is:

1. A crystal pulling apparatus for continuously oxidizing silicon monoxide, silicon vapor, and hypostoichiometric silicon dioxide produced during a crystal pulling process, the apparatus comprising:

a housing;

a hot zone;

a thermal shield;

a gas inlet located above the hot zone within the apparatus to allow an argon gas stream to flow downwardly within the apparatus through the hot zone and into an exhaust tunnel to purge hot exhaust gases from the hot zone; and a gas inlet located in an exhaust tunnel downstream from the hot zone relative to the direction of flow of the argon stream to allow an oxygen-containing gas to enter the exhaust tunnel and continuously oxidize silicon monoxide, silicon vapor, and hypostoichiometric silicon dioxide produced during the production of the silicon ingot and thereby reduce the amount of hypostoichiometric silicon dioxide in the crystal pulling apparatus.

2. An apparatus as set forth in claim 1 further comprising a purge tube to direct the argon stream into the growing ingot.

3. An apparatus as set forth in claim 1 wherein the oxygen-containing gas is air.

4. An apparatus as set forth in claim 1 wherein the gas inlet downstream from the hot zone allows oxygen containing gas into the apparatus such that the diffusion of oxygen from the gas through the argon stream and into the hot zone is not sufficient to cause perfect structure loss in the growing ingot.

5. An apparatus as set forth in claim 1 wherein the gas inlet downstream from the hot zone allows oxygen containing gas into the apparatus such that the diffusion of oxygen from the gas through the argon and into the hot zone is no greater than about 100 ppm.

6. An apparatus as set forth in claim 1 wherein the gas inlet downstream from the hot zone allows oxygen containing gas into the apparatus such that the diffusion of oxygen from the gas through the argon and into the hot zone is no greater than about 50 ppm.

7. An apparatus as set forth in claim 1 wherein the gas inlet downstream from the hot zone allows oxygen containing gas into the apparatus such that the diffusion of oxygen from the gas through the argon and into the hot zone is no greater than about 10 ppm.

8. An apparatus as set forth in claim 1 wherein the argon gas is introduced into the apparatus at a flow of between about 20 slm and about 150 slm to create a pressure of between about 5 Torr and about 25 Torr and the oxygen containing gas is introduced into the apparatus at a flow of between about 5 slm and about 20 slm such that the diffusion of oxygen from the gas through the argon and into the hot zone is no greater than about 100 ppm.

9. An apparatus as set forth in claim 1 wherein the argon gas is introduced into the apparatus at a flow of about 100 slm, the oxygen containing gas is air and is injected at a flow of about 20 slm into an exhaust line having a diameter of about 4 inches, and the gas inlet is located about 2 centimeters downstream from the hot zone.

10. An apparatus as set forth in claim 1 wherein the gas inlet downstream from the hot zone is located at least about 2 centimeters downstream from the hot zone.

11. A crystal pulling apparatus for continuously oxidizing silicon monoxide, silicon vapor, and hypostoichiometric silicon dioxide produced during a crystal pulling process, the apparatus comprising:
- a thermal shield;
- a gas inlet located above the hot zone within the apparatus to allow an argon gas stream to flow downwardly within the apparatus through the hot zone and into an exhaust tunnel to purge hot exhaust gases from the hot zone; and
- a gas inlet located in an exhaust tunnel downstream from the hot zone relative to the direction of flow of the argon stream to allow an oxygen-containing gas to enter the exhaust tunnel and continuously oxidize silicon monoxide, silicon vapor, and hypostoichiometric silicon dioxide produced during the production of the silicon ingot and thereby reduce the amount of hypostoichiometric silicon dioxide in the crystal pulling apparatus.

12. An apparatus as set forth in claim 11 further comprising a purge tube to direct the argon stream into the growing ingot.

13. An apparatus as set forth in claim 11 wherein the oxygen-containing gas is air.

14. An apparatus as set forth in claim 11 wherein the gas inlet downstream from the hot zone allows oxygen containing gas into the apparatus such that the diffusion of oxygen from the gas through the argon stream and into the hot zone is not sufficient to cause perfect structure loss in the growing ingot.

15. An apparatus as set forth in claim 11 wherein the gas inlet downstream from the hot zone allows oxygen containing gas into the apparatus such that the diffusion of oxygen from the gas through the argon and into the hot zone is no greater than about 100 ppm.

16. An apparatus as set forth in claim 11 wherein the gas inlet downstream from the hot zone allows oxygen containing gas into the apparatus such that the diffusion of oxygen from the gas through the argon and into the hot zone is no greater than about 50 ppm.

17. An apparatus as set forth in claim 11 wherein the gas inlet downstream from the hot zone allows oxygen containing gas into the apparatus such that the diffusion of oxygen from the gas through the argon and into the hot zone is no greater than about 10 ppm.

18. An apparatus as set forth in claim 11 wherein the argon gas is introduced into the apparatus at a flow of between about 20 slm and about 150 slm to create a pressure of between about 5 Torr and about 25 Torr and the oxygen containing gas is introduced into the apparatus at a flow of between about 5 slm and about 20 slm such that the diffusion of oxygen from the gas through the argon and into the hot zone is no greater than about 100 ppm.

19. An apparatus as set forth in claim 11 wherein the argon gas is introduced into the apparatus at a flow of about 100 slm, the oxygen containing gas is air and is injected at a flow of about 20 slm into an exhaust line having a diameter of about 4 inches, and the gas inlet is located about 2 centimeters downstream from the hot zone.

20. An apparatus as set forth in claim 11 wherein the gas inlet downstream from the hot zone is located at least about 2 centimeters downstream from the hot zone.

21. A crystal pulling apparatus for continuously oxidizing silicon monoxide, silicon vapor, and hypostoichiometric silicon dioxide produced during a crystal pulling process, the apparatus comprising:
- a housing;
- a susceptor;
- a thermal shield;
- a hot zone;
- a gas inlet located above the hot zone within the apparatus to allow an argon gas stream to flow downwardly within the apparatus through the hot zone and into an exhaust tunnel to purge hot exhaust gases from the hot zone; and
- a gas inlet located in an exhaust tunnel downstream from the hot zone relative to the direction of flow of the argon stream to allow an oxygen-containing gas to enter the exhaust tunnel and continuously oxidize silicon monoxide, silicon vapor, and hypostoichiometric silicon dioxide produced during the production of the silicon ingot and thereby reduce the amount of hypostoichiometric silicon dioxide in the crystal pulling apparatus.

22. An apparatus as set forth in claim 21 further comprising a heater.

23. An apparatus as set forth in claim 21 further comprising a heat reflector and insulation.

* * * * *